US012693359B2

(12) United States Patent
Mizuno et al.

(10) Patent No.: US 12,693,359 B2
(45) Date of Patent: Jul. 28, 2026

(54) SUPERCONDUCTING MAGNET DEVICE AND MAGNETIC RESONANCE IMAGING APPARATUS

(71) Applicant: Canon Kabushiki Kaisha, Tokyo (JP)

(72) Inventors: Katsutoshi Mizuno, Nasushiobara (JP); Takehiro Shibuya, Nasushiobara (JP)

(73) Assignee: Canon Kabushiki Kaisha, Tokyo (JP)

( * ) Notice: Subject to any disclaimer, the term of this patent is extended or adjusted under 35 U.S.C. 154(b) by 144 days.

(21) Appl. No.: 18/797,686

(22) Filed: Aug. 8, 2024

(65) Prior Publication Data

US 2025/0060436 A1 Feb. 20, 2025

(30) Foreign Application Priority Data

Aug. 14, 2023 (JP) ................................. 2023-132100

(51) Int. Cl.
*G01R 33/38* (2006.01)
*G01R 33/3815* (2006.01)
(52) U.S. Cl.
CPC ..... *G01R 33/3815* (2013.01); *G01R 33/3804* (2013.01)
(58) Field of Classification Search
CPC ............ G01R 33/3815; G01R 33/3804; G01R 33/56563; G01R 33/3802
See application file for complete search history.

(56) References Cited

U.S. PATENT DOCUMENTS 5,633,588 A * 5/1997 Hommei ............ G01R 33/3815
324/319

FOREIGN PATENT DOCUMENTS

JP 2000-133850 A 5/2000

* cited by examiner

*Primary Examiner* — G. M. A Hyder
(74) *Attorney, Agent, or Firm* — Oblon, McClelland, Maier & Neustadt, L.L.P.

(57) ABSTRACT

A superconducting magnet device of an embodiment includes a vacuum vessel, a superconducting coil, and an insulating load support. The insulating load support supports the superconducting coil through the thermal deformation cancellation mechanism that generates a second deformation amount in a direction in which a first deformation amount applied from the superconducting coil to the insulating load support is canceled out due to thermal deformation occurring in the superconducting coil when the inside of the vacuum vessel is cooled to an extremely low temperature. The thermal deformation cancellation mechanism includes a thermal deformation member. The thermal deformation member includes at least a material having a second coefficient of thermal expansion determined based on a first coefficient of thermal expansion of a material forming the superconducting coil, and generates the second deformation amount by thermally deforming in the same environment as the superconducting coil.

8 Claims, 8 Drawing Sheets

SUPERCONDUCTING MAGNET DEVICE AND MAGNETIC RESONANCE IMAGING APPARATUS

CROSS-REFERENCE TO RELATED APPLICATION

The present application claims priority based on Japanese Patent Application No. 2023-132100, filed Aug. 14, 2023, the content of which is incorporated herein by reference.

FIELD

Embodiments of the present invention relate to a superconducting magnet device and a magnetic resonance imaging apparatus.

BACKGROUND

Conventionally, magnetic resonance imaging (MRI) apparatuses have been used as medical imaging diagnostic apparatuses that perform image-based diagnosis. A magnetic resonance imaging apparatus (hereinafter referred to as an "MRI apparatus") is an apparatus that captures a tomographic image of a subject by receiving, with a radio frequency (RF) coil, MR signals excited by RF pulses radiated in a strong magnetic field.

MRI apparatuses use a superconducting magnet device composed of a superconducting coil that generates strong magnetic fields. A superconducting coil constituting a superconducting magnet device needs to be used in an extremely low temperature environment. For this reason, a superconducting magnet device used in MRI apparatuses is configured such that a superconducting coil is housed in a vacuum vessel and infiltration of heat from the outside of the vacuum vessel at room temperature into the superconducting coil side is minimized, for example. Furthermore, some superconducting magnet devices have a configuration in which a superconducting coil is housed in a radiation shield and housed in this state in a vacuum vessel. In the vacuum vessel or the radiation shield, the superconducting coil or the radiation shield is supported by a load support such as a rod or a cylinder made of fiber reinforced plastics (FRP).

However, when a superconducting coil housed in a vacuum vessel or a radiation shield in which a superconducting coil is housed is cooled to an extremely low temperature, thermal deformation occurs in the outer shape, although it is slight. For example, a metal material forming the superconducting coil or radiation shield shrinks due to thermal contraction or expands due to thermal expansion. In this case, in a superconducting magnet device, a load is applied in a bending direction to a load support that supports the superconducting coil or the radiation shield in the vacuum vessel. Then, in the superconducting magnet device, thermal deformation (thermal contraction or thermal expansion) of the superconducting coil and the radiation shield and the reaction force against the load in the bending direction in the load support cause deviation of the position of the superconducting coil in a way that is difficult to predict. This positional deviation of the superconducting coil can be a factor that causes deterioration in image quality of tomographic images of a subject captured using an MRI apparatus.

DETAILED DESCRIPTION

A superconducting magnet device and a magnetic resonance imaging apparatus of an embodiment will be described below with reference to the drawings.

A superconducting magnet device of an embodiment is a superconducting magnet device comprising a superconducting coil, an insulating load support, a vacuum vessel, and a thermal deformation cancellation mechanism, at least the superconducting coil being housed in the vacuum vessel in a state in which the superconducting coil is supported by the insulating load support. The insulating load support is configured to support the superconducting coil through the thermal deformation cancellation mechanism, the thermal deformation cancellation mechanism being configured to generate a second deformation amount in a direction in which a first deformation amount applied from the superconducting coil to the insulating load support is canceled out due to thermal deformation occurring in the superconducting coil when the inside of the vacuum vessel is cooled to an extremely low temperature. The thermal deformation cancellation mechanism includes a thermal deformation member. The thermal deformation member includes at least a material having a second coefficient of thermal expansion determined on the basis of a first coefficient of thermal expansion of a material forming the superconducting coil, and the thermal deformation member being configured to generate the second deformation amount by thermally deforming in the same environment as the superconducting coil.

A magnetic resonance imaging (MRI) apparatus (hereafter referred to as an "MRI apparatus") is a medical imaging diagnostic apparatus that irradiates a subject (e.g., a human body) with radio frequency (RF) pulses while applying a strong magnetic field to the subject, receives electromagnetic waves generated from hydrogen nuclei in the body of the subject according to the nuclear magnetic resonance phenomenon using an RF coil, and captures a tomographic image (hereafter referred to as an "MR image") of the subject by reconstructing a nuclear magnetic resonance signal (hereafter referred to as an "MR signal") based on the received electromagnetic waves. The MRI apparatus can also capture an MR image of the subject by reconstructing an MR signal based on electromagnetic waves received through an RF coil attached to the subject. The MRI apparatus displays the MR image of the subject, allowing a person performing MRI examination (such as a doctor or a technician) to visually check whether the subject has a lesion or not.

Figure 1:
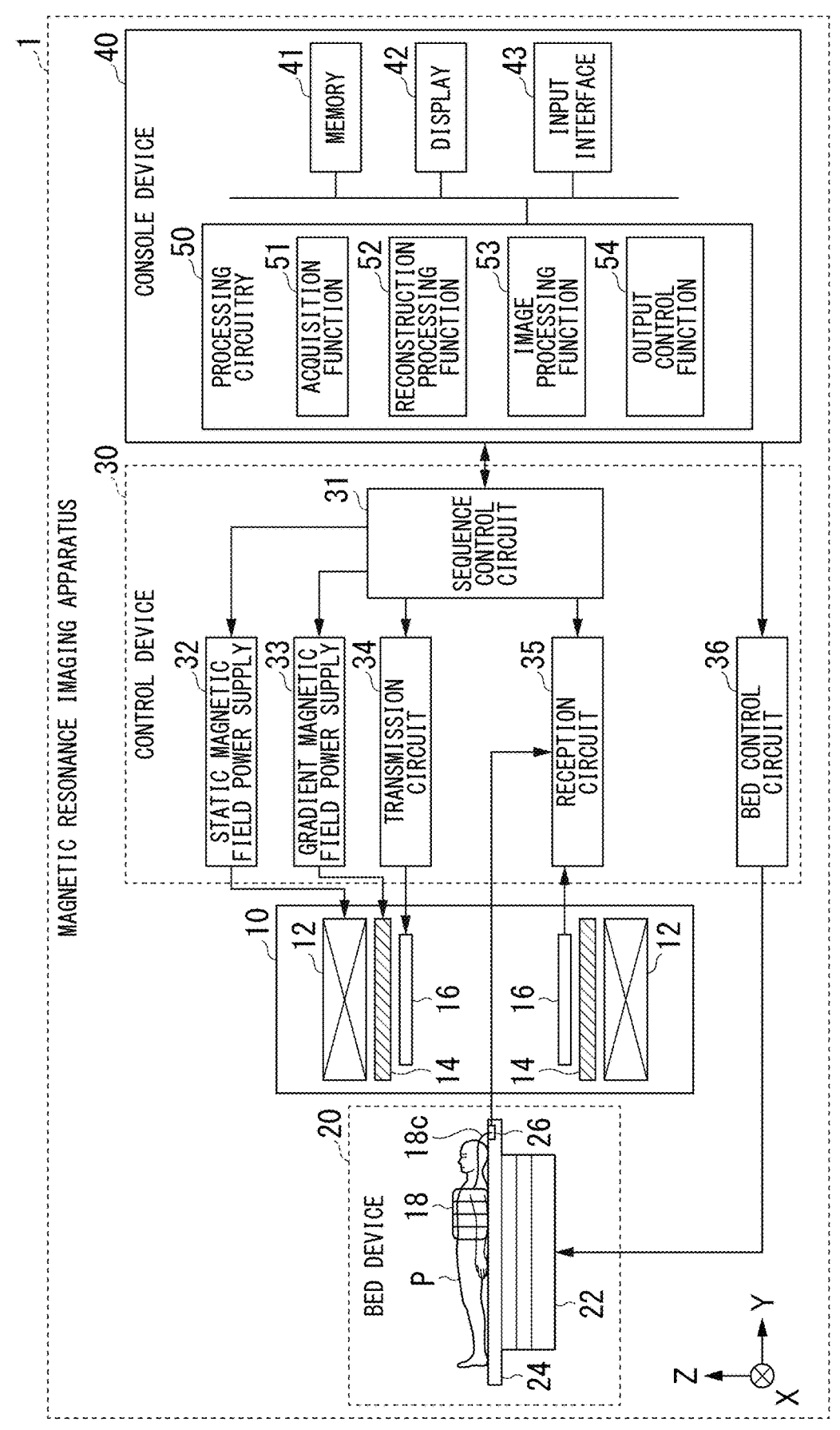
FIG. 1 is a diagram showing an example of a configuration of a magnetic resonance imaging apparatus using a superconducting magnet device according to an embodiment.

FIG. 1 is a diagram showing an example of a configuration of a magnetic resonance imaging apparatus (MRI apparatus) using a superconducting magnet device according to an embodiment. The MRI apparatus 1 includes, for example, a gantry device 10, a bed device 20, a control device 30, and a console device 40. Although the control device 30 and the console device 40 are described as being separate from the gantry device 10 in the present embodiment, the gantry device 10 may include some or all of the components of the control device 30 and the console device 40. The MRI apparatus 1 is an example of a "magnetic resonance imaging apparatus."

The gantry device 10 includes, for example, a static magnetic field magnet 12, a gradient magnetic field coil 14, and an RF coil 16. Further, the gantry device 10 includes, for example, an RF coil 18 that can be attached to a subject P as a component of the RF coil 16.

The static magnetic field magnet 12 is a superconducting magnet device formed in a hollow and approximately cylindrical shape. The static magnetic field magnet 12 generates a uniform strong static magnetic field in the internal space. The static magnetic field magnet 12 has a superconducting coil housed in a vacuum vessel. In the static magnetic field magnet 12, the superconducting coil may be housed in a vacuum vessel while being housed in a radiation shield. The superconducting coil receives power from a static magnetic field power supply 32 and generates a strong static magnetic field in an imaging space (i.e., in the bore) of the MRI apparatus 1 in which the subject P is introduced. The detailed configuration of the static magnetic field magnet 12 will be described later. In the present embodiment, the central axis of the gantry device 10 or the longitudinal direction of the top plate 24 of the bed device 20 is defined as a Y-axis direction, an axis orthogonal to the Y-axis direction and horizontal to the floor surface of the room in which the MRI apparatus 1 is installed is defined as an X-axis direction, and a direction orthogonal to the Y-axis direction and perpendicular to the floor surface is defined as a Z-axis direction. In addition, in the present embodiment, the Y-axis direction is assumed to be the same direction as static magnetic fields. The static magnetic field magnet 12 is an example of a "superconducting magnet device."

The gradient magnetic field coil 14 is a coil formed in a hollow and substantially cylindrical shape. The gradient magnetic field coil 14 is disposed inside the static magnetic field magnet 12. The gradient magnetic field coil 14 is formed by combining three coils corresponding to a mutually orthogonal X-axis, Y-axis, and Z-axis. Each of the three coils corresponding to the directions of the axes individually receives a current from a gradient magnetic field power supply 33, and generates, in the bore, a gradient magnetic field in which magnetic field strength changes along each of the X-axis, Y-axis, and Z-axis.

The RF coil 16 is a whole-body coil that is housed in the gantry device 10 and is configured to surround the subject P in the imaging space. The RF coil 16 receives RF pulses from a transmission circuit 34 to generate a high-frequency magnetic field and receives MR signals emitted from the subject P under the influence of the high-frequency magnetic field. The RF coil 16 outputs the received MR signals to a reception circuit 35.

The RF coil 18 is a local coil that is attached to the subject P. The RF coil 18 is available in various shapes for each part of the subject P to be imaged (hereinafter referred to as an "imaging part"). FIG. 1 shows an example of the RF coil 18 attached to the torso of the subject P. The RF coil 18 receives MR signals emitted from the subject P due to the influence of the high frequency magnetic field generated by the RF coil 16 and outputs the received MR signals to the reception circuit 35. The RF coil 18 outputs the received MR signals to the reception circuit 35 via a coil cable 18c connected to a coil port 26 disposed on the top plate 24.

The bed device 20 is a device that introduces the subject P to be imaged into the inside of the gantry device 10, that is, into the bore of the gantry device 10, by moving the top plate 24 on which the subject P is placed. In other words, the bed device 20 is a device that moves the top plate 24 such that an imaging part of the subject P is in the cavity of the static magnetic field magnet 12, the gradient magnetic field coil 14, and the RF coil 16, that is, in a position suitable for imaging in a magnetic field generated in an imaging port. The bed device 20 includes, for example, a base 22 and the top plate 24.

The base 22 moves the top plate 24 on which the subject P is placed in the horizontal direction (X-axis direction and Y-axis direction) or the vertical direction (Z-axis direction) according to the operation of a bed driving device that is not shown, which operates in response to a control signal output from a bed control circuit 36.

The top plate 24 is a plate-shaped member on which the subject P is placed. The top plate 24 has the coil port 26 to which the coil cable 18c of the RF coil 18 attached to the subject P is connected. The coil port 26 is disposed on the top plate 24, for example, at four corners.

The control device 30 controls the operations of the gantry device 10 and the bed device 20 in response to control of the console device 40. The control device 30 includes, for example, a sequence control circuit 31, the static magnetic field power supply 32, the gradient magnetic field power supply 33, the transmission circuit 34, the reception circuit 35, and the bed control circuit 36. The control device 30 may be provided in the gantry device 10 or in the console device 40.

The sequence control circuit 31 is a sequencer that performs imaging of the subject P by driving the static magnetic field power supply 32, the gradient magnetic field power supply 33, the transmission circuit 34, and the reception circuit 35 on the basis of sequence information set by the console device 40. The sequence control circuit 31 may be, for example, a processing circuit having a processor such as a central processing unit (CPU). The sequence information is information in which a procedure for performing imaging processing for imaging the subject P in the MRI apparatus 1 is defined in advance. The sequence information indicates, for example, the operations of the static magnetic field power supply 32, the gradient magnetic field power supply 33, the transmission circuit 34, and the reception circuit 35 at the time of imaging the subject P and operation timings thereof (hereinafter referred to as "events") in chronological order. More specifically, the sequence information indicates, as events, the level and timing of power (voltage) supplied by the static magnetic field power supply 32 to the static magnetic field magnet 12, the magnitude of a current supplied by the gradient magnetic field power supply 33 to the gradient magnetic field coil 14 and a current supply timing, the strength of RF pulses transmitted (supplied) by the transmission circuit 34 to the RF coil 16 and an RF pulse supply timing, a timing at which the reception circuit 35 receives (detects) MR signals output by the RF coil 16 and the RF coil 18, and the like. The sequence control circuit 31 drives the static magnetic field power supply 32, the gradient magnetic field power supply 33, the transmission circuit 34, and the reception circuit 35 by sequentially executing events indicated in the sequence information at a timing based on a predetermined clock signal, and when the reception circuit 35 receives an MR signal, transfers the received MR signal (more specifically, data representing the MR signal received by the reception circuit 35 (hereinafter referred to as "MR data")) to the console device 40. The clock signal is generated by a clock generation circuit (not shown) including a clock oscillator, for example, and represents a timing used as a reference for the operation of imaging the subject P in the MRI apparatus 1. The clock signal is supplied to each component of the control device 30. The sequence control circuit 31 sequentially executes events at a timing based on the clock signal such that the static magnetic field power supply 32, the gradient magnetic field power supply 33, the transmission circuit 34, and the reception circuit 35 operate in synchronization with each other.

The sequence control circuit 31 is an example of "control circuitry."

The static magnetic field power supply 32 supplies power (voltage) to the superconducting coil housed in a vacuum vessel in the static magnetic field magnet 12 to generate a static magnetic field.

The gradient magnetic field power supply 33 supplies a current individually to each of the three coils in the gradient magnetic field coil 14, which corresponds to the direction of each axis.

The transmission circuit 34 supplies RF pulses to the RF coil 16. The RF pulses supplied by the transmission circuit 34 to the RF coil 16 are pulses corresponding to the Larmor frequency determined by the type of target atomic nucleus and the strength of the magnetic field.

The reception circuit 35 detects MR signals output by the RF coil 16 and the RF coil 18, and generates MR data representing the detected MR signals. The reception circuit 35 generates MR data, for example, by converting the MR signals into digital data. The reception circuit 35 outputs the generated MR data to the sequence control circuit 31. The sequence control circuit 31 transfers the MR data output by the reception circuit 35 to the console device 40.

The bed control circuit 36 outputs a control signal for moving the base 22 and the top plate 24 on which the subject P is placed to a bed driving device (not shown) provided in the bed device 20 in response to control of the console device 40.

The console device 40 controls the entire MRI apparatus 1 and collects MR data. The console device 40 includes, for example, a memory 41, a display 42, an input interface 43, and processing circuitry 50.

The memory 41 is realized, for example, by a semiconductor memory element such as a read only memory (ROM), a random access memory (RAM), or a flash memory, a hard disk drive (HDD), an optical disc, or the like. The memory 41 stores data such as MR data output by the sequence control circuit 31 and a reconstructed image (MR image) generated on the basis of MR data.

The display 42 displays various types of information. For example, the display 42 displays an image generated by the processing circuitry 50, a graphical user interface (GUI) image for receiving various operations performed by a person performing an MRI examination, etc. The display 42 is, for example, a liquid crystal display (LCD), a cathode ray tube (CRT) display, an organic electroluminescence (EL) display, or the like.

The input interface 43 receives various input operations from a person performing an MRI examination, and outputs an electrical signal indicating the content of the received input operations to the processing circuitry 50. For example, the input interface 43 receives input operations such as acquisition conditions at the time of acquiring MR data, generation conditions at the time of generating MR data, reconstruction conditions at the time of reconstructing a reconstructed image, and image processing conditions at the time of generating a post-processed image from the reconstructed image. The input interface 43 is realized by, for example, a mouse, a keyboard, a touch panel, a trackball, a switch, a button, a joystick, a camera, an infrared sensor, a microphone, or the like. When the input interface 43 is a touch panel, the display 42 may be formed integrally with the input interface 43. The input interface 43 may be provided in the gantry device 10.

The processing circuitry 50 controls the overall operation of the MRI apparatus 1. The processing circuitry 50 sets sequence information in the sequence control circuit 31. The processing circuitry 50 executes, for example, an acquisition function 51, a reconstruction processing function 52, an image processing function 53, an output control function 54, and the like. The processing circuitry 50 realizes these functions by, for example, a hardware processor provided in a computer device executing a program (software) stored in the memory 41, which is a storage device (storage circuit).

The hardware processor is circuitry such as a CPU, a graphics processing unit (GPU), an application specific integrated circuit (ASIC), a programmable logic device (for example, a simple programmable logic device (SPLD) or complex programmable logic device (CPLD), or a field programmable gate array (FPGA)).

The acquisition function 51 acquires MR data transferred by the sequence control circuit 31. The MR data is MR signals converted into digital data by the reception circuit 35.

The reconstruction processing function 52 performs predetermined reconstruction processing on the MR data acquired by the acquisition function 51 to generate a reconstructed image. The reconstruction processing function 52 stores the generated reconstructed image in the memory 41.

The image processing function 53 converts the reconstructed image stored in the memory 41 into a three-dimensional image or cross-sectional image data of an arbitrary cross section through a known method on the basis of an input operation received by the input interface 43. The image processing function 53 stores the converted cross-sectional image data in the memory 41 as an MR image.

The output control function 54 controls, for example, a display mode in the display 42. The output control function 54 outputs the MR image generated by the image processing function 53 and stored in the memory 41 to the display 42 to display the MR image. Accordingly, the person performing the MRI examination can visually check the MR image displayed on the display 42 and perform a diagnosis or examination regarding whether or not the subject P has a lesion. The output control function 54 may display GUI images and the like for receiving various operations from the person performing the MRI examination.

An MR image, a tomographic image, and a reconstructed image are an example of a "magnetic resonance image."

First Embodiment

Figure 2:
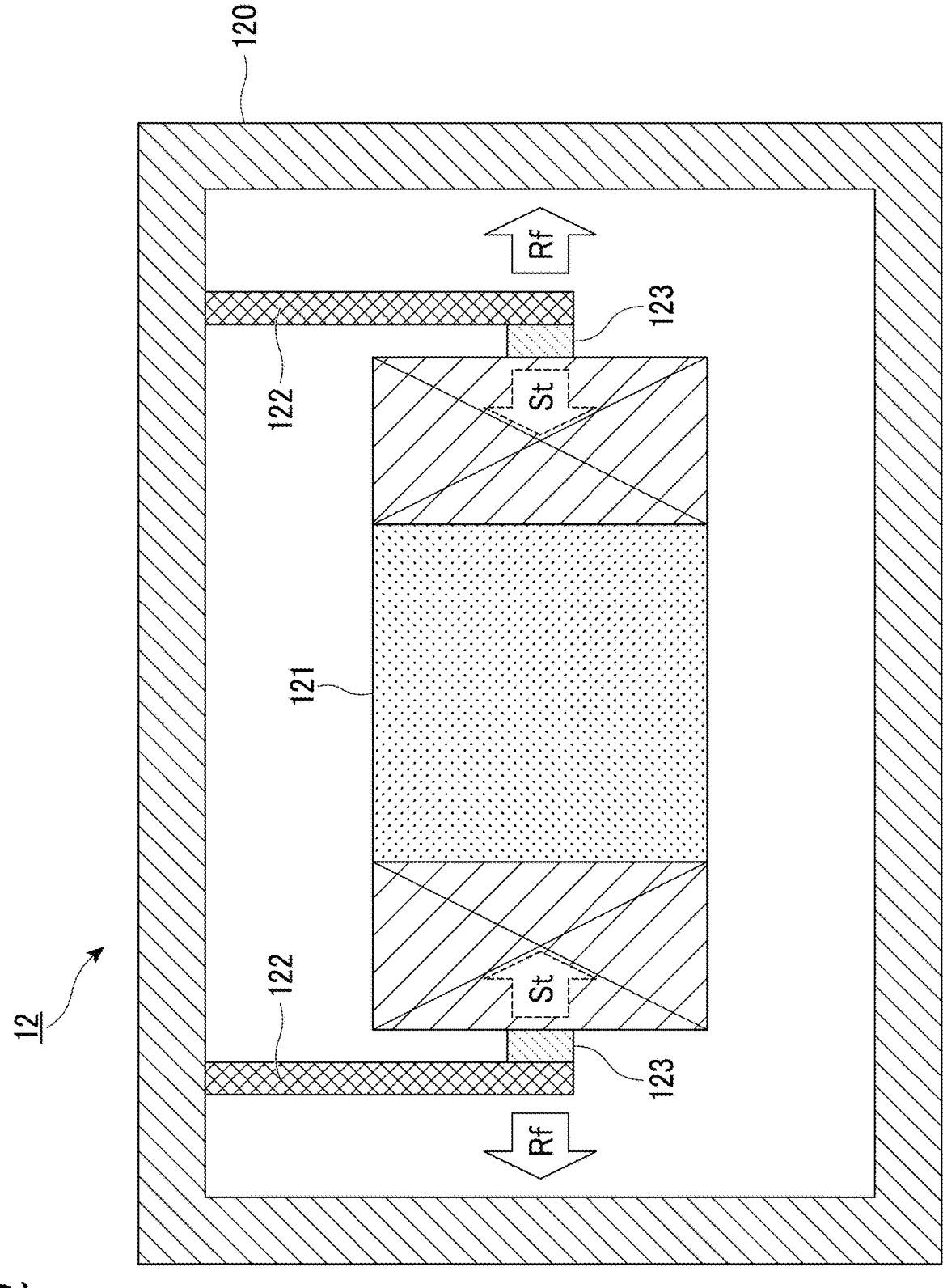
FIG. 2 is a diagram showing an example of a configuration of a superconducting magnet device according to a first embodiment.

Next, the configuration of the static magnetic field magnet 12 provided in the MRI apparatus 1 and the structure for supporting a superconducting coil in the static magnetic field magnet 12 will be described. FIG. 2 is a diagram showing an example of a configuration of the superconducting magnet device (static magnetic field magnet 12) according to the first embodiment. FIG. 2 shows a schematic configuration of the static magnetic field magnet 12 configured to support a superconducting coil 121 in a vacuum vessel 120 by suspending the superconducting coil from above using an insulating load support 122. More specifically, FIG. 2 shows a configuration in which the insulating load support 122 disposed at each of two locations in the vacuum vessel 120 is connected to the center of the superconducting coil 121 via a thermal deformation cancellation mechanism 123.

The insulating load support 122 is, for example, a rod or cylindrical member made of fiber reinforced plastics (FRP). The inside of the vacuum vessel 120 is cooled to an extremely low temperature, for example, by a cooling device that is not shown. For this reason, the external shape of the superconducting coil 121 is thermally deformed, for example, by a small amount of about 0.3%, when cooled to an extremely low temperature. Due to this thermal deformation of the external shape of the superconducting coil 121, a load (stress) in a bending direction is applied to the insulating load support 122. FIG. 2 shows an example of a state in which stress due to thermal contraction St as a result of thermal contraction (shrinking of the external shape) of the superconducting coil 121 in an extremely low temperature environment is applied to the insulating load support 122. The thermal contraction St is an example of a "first deformation amount."

The thermal deformation cancellation mechanism 123 deforms in a direction in which the thermal deformation of the superconducting coil 121 is canceled out (offset), and thus no stress acts on the insulating load support 122. FIG. 2 shows an example of a state in which the thermal deformation cancellation mechanism 123 applies deformation Rf to the side opposite the thermal contraction St, and thus no stress is generated in the insulating load support 122. As a result, the positional deviation of the superconducting coil 121 in the vacuum vessel 120 is reduced in the static magnetic field magnet 12. The deformation Rf is an example of a "second deformation amount."

(First Configuration of Thermal Deformation Cancellation Mechanism)

Figure 3:
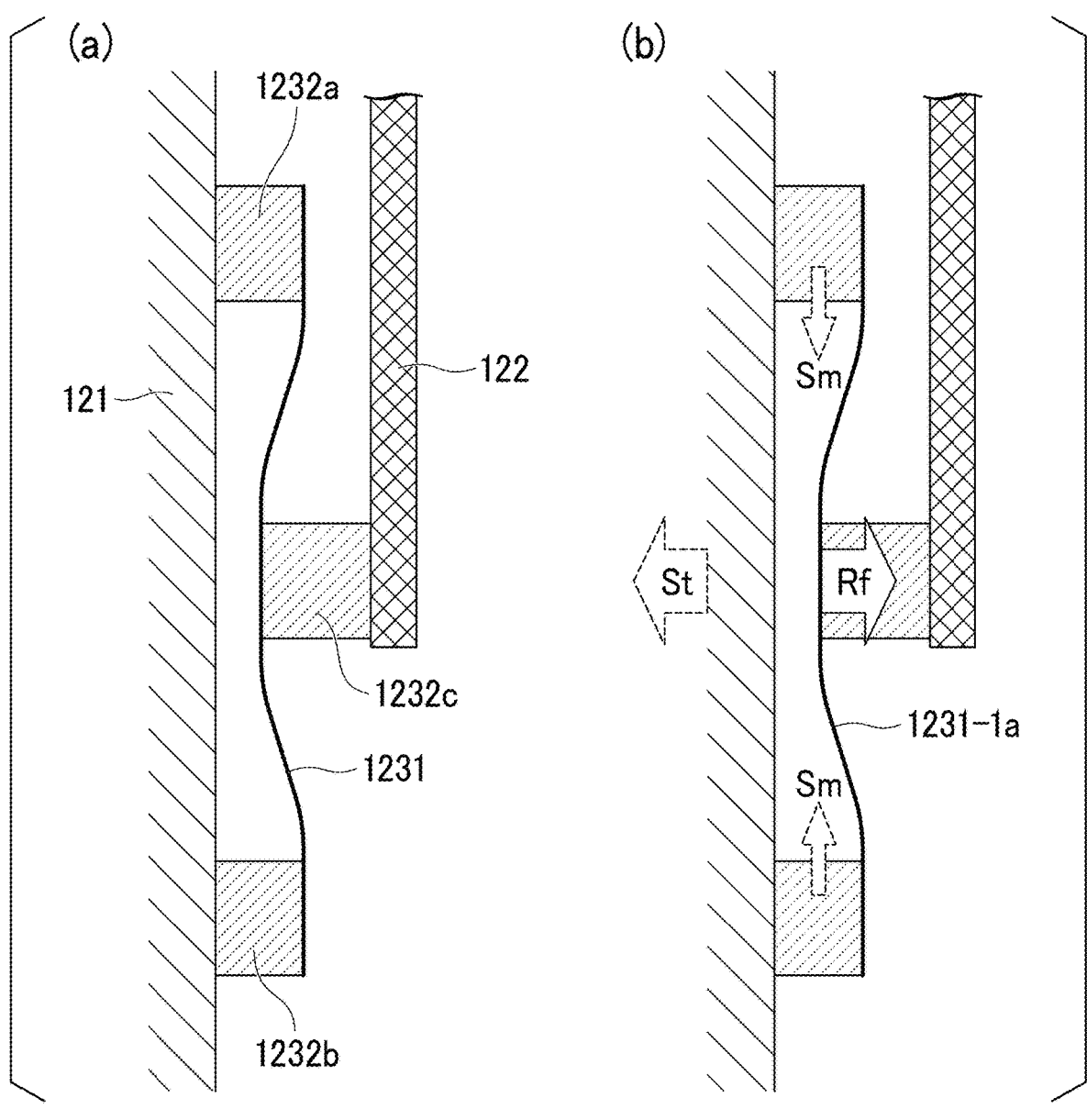
FIG. 3 is a diagram showing an example (part 1) of a structure of a thermal deformation cancellation mechanism that supports a superconducting coil in the superconducting magnet device according to the first embodiment.

Here, the structure of the thermal deformation cancellation mechanism 123 will be described. FIG. 3 is a diagram showing an example of the structure of the thermal deformation cancellation mechanism 123 that supports the superconducting coil 121 in the superconducting magnet device (static magnetic field magnet 12) according to the first embodiment. FIG. 3 shows an example of the structure of the thermal deformation cancellation mechanism 123 located on the right side of FIG. 2 in the static magnetic field magnet 12 shown in FIG. 2. FIG. 3(a) shows an example of the structure of the thermal deformation cancellation mechanism 123, and FIG. 3(b) shows an example of the relationship between the thermal contraction St applied to the insulating load support 122 when the superconducting coil 121 has been thermally deformed and the deformation Rf of the thermal deformation cancellation mechanism 123. More specifically, FIG. 3(b) shows an example of the relationship between the thermal contraction St and the deformation Rf of the thermal deformation cancellation mechanism 123 when the superconducting coil 121 has been thermally contracted.

First, the configuration of the thermal deformation cancellation mechanism 123 will be described with reference to FIG. 3(a). The thermal deformation cancellation mechanism 123 includes a plate 1231, a fastening part 1232a, a fastening part 1232b, and a fastening part 1232c. In the following description, when the fastening parts 1232a, 1232b, and 1232c are not distinguished from one another, they are simply referred to as "fastening parts 1232."

The plate 1231 is a metal plate that cancels out (offsets) the deformation amount of the insulating load support 122 due to thermal deformation of the superconducting coil 121. The plate 1231 cancels out (offsets) the deformation amount of the insulating load support 122 by thermally deforming in the same environment as the superconducting coil 121. The plate 1231 has a curved shape with a curved portion whose central portion is concave toward the side of the superconducting coil 121. The plate 1231 deforms in a direction opposite to the direction of thermal deformation of the superconducting coil 121 according to the temperature of the inside of the vacuum vessel 120 in which the plate 1231 is housed along with the superconducting coil 121, and cancels out (offsets) deformation of the insulating load support 122 by the thermal deformation occurring in the superconducting coil 121. The plate 1231 cancels out (offsets) deformation of the insulating load support 122 from the superconducting coil 121 due to the difference between the coefficient of thermal expansion of thermal deformation of the superconducting coil 121 and the coefficient of thermal expansion of thermal deformation of the plate 1231. The coefficient of thermal expansion of the plate 1231 is determined on the basis of a coefficient of thermal expansion ascertained in advance for each material that constitutes (forms) the superconducting coil 121, and a material that constitutes (forms) the plate 1231 is selected on the basis of the determined coefficient of thermal expansion. In the configuration of the thermal deformation cancellation mechanism 123 shown in FIG. 3(a), a material having a coefficient of thermal expansion greater than that of the superconducting coil 121 is selected as a material that forms the plate 1231.

The plate 1231 is an example of a "thermal deformation member." The coefficient of thermal expansion at which the superconducting coil 121 thermally deforms is an example of a "first coefficient of thermal expansion," and the coefficient of thermal expansion at which the plate 1231 deforms due to heat is an example of a "second coefficient of thermal expansion."

The fastening part 1232 is a part for connecting the plate 1231 to the superconducting coil 121 or the insulating load support 122. More specifically, the fastening part 1232a and the fastening part 1232b connect opposing ends to the superconducting coil 121 such that the concave curved part of the plate 1231 is concave toward the side of the superconducting coil 121, and the fastening part 1232c connects the center of the curved part of the plate 1231 to the insulating load support 122. Since each of the fastening parts 1232 is also housed in the vacuum vessel 120 along with the superconducting coil 121 and the plate 1231, it is conceivable that the fastening parts 1232 are thermally deformed according to the temperature of the inside of the vacuum vessel 120. In this case, the coefficient of thermal expansion of the plate 1231 may be determined such that thermal deformation of the fastening parts 1232 is canceled out (offset) as well, and a material that constitutes (forms) the plate 1231 may be selected. In the following description, it is assumed that the fastening parts 1232 do not thermally deform for ease of description.

Next, an example of the relationship between the thermal contraction St and the deformation Rf of the thermal deformation cancellation mechanism 123 when the superconducting coil 121 has thermally contracted when the inside of the vacuum vessel 120 has been cooled to an extremely low temperature will be described with reference to FIG. 3(*b*). Here, a plate 1231-1*a* shown in FIG. 3(*b*) has a coefficient of thermal expansion according to the temperature of the inside of the vacuum vessel 120, which is greater than the coefficient of thermal expansion of the superconducting coil 121.

When the superconducting coil 121 thermally contracts when the inside of the vacuum vessel 120 is cooled to an extremely low temperature, the fastening parts 1232*a* and 1232*b* are moved in a direction in which they approach each other, as shown by movement Sm in FIG. 3(*b*). On the other hand, the plate 1231 has a relatively larger coefficient of thermal expansion than the superconducting coil 121, and thus the plate 1231 thermally contracts in a direction in which the concave curved shape expands (a direction in which the concave curved part expands and becomes flat), causing deformation Rf toward the right side of FIG. 3(*b*). As a result, in the static magnetic field magnet 12, the thermal contraction St of the superconducting coil 121 relative to the insulating load support 122, which occurs when the inside of the vacuum vessel 120 is cooled to an extremely low temperature, is canceled out (offset), and the positional deviation of the superconducting coil 121 within the vacuum vessel 120 is reduced.

(Second Configuration of Thermal Deformation Cancellation Mechanism)

Figure 4:
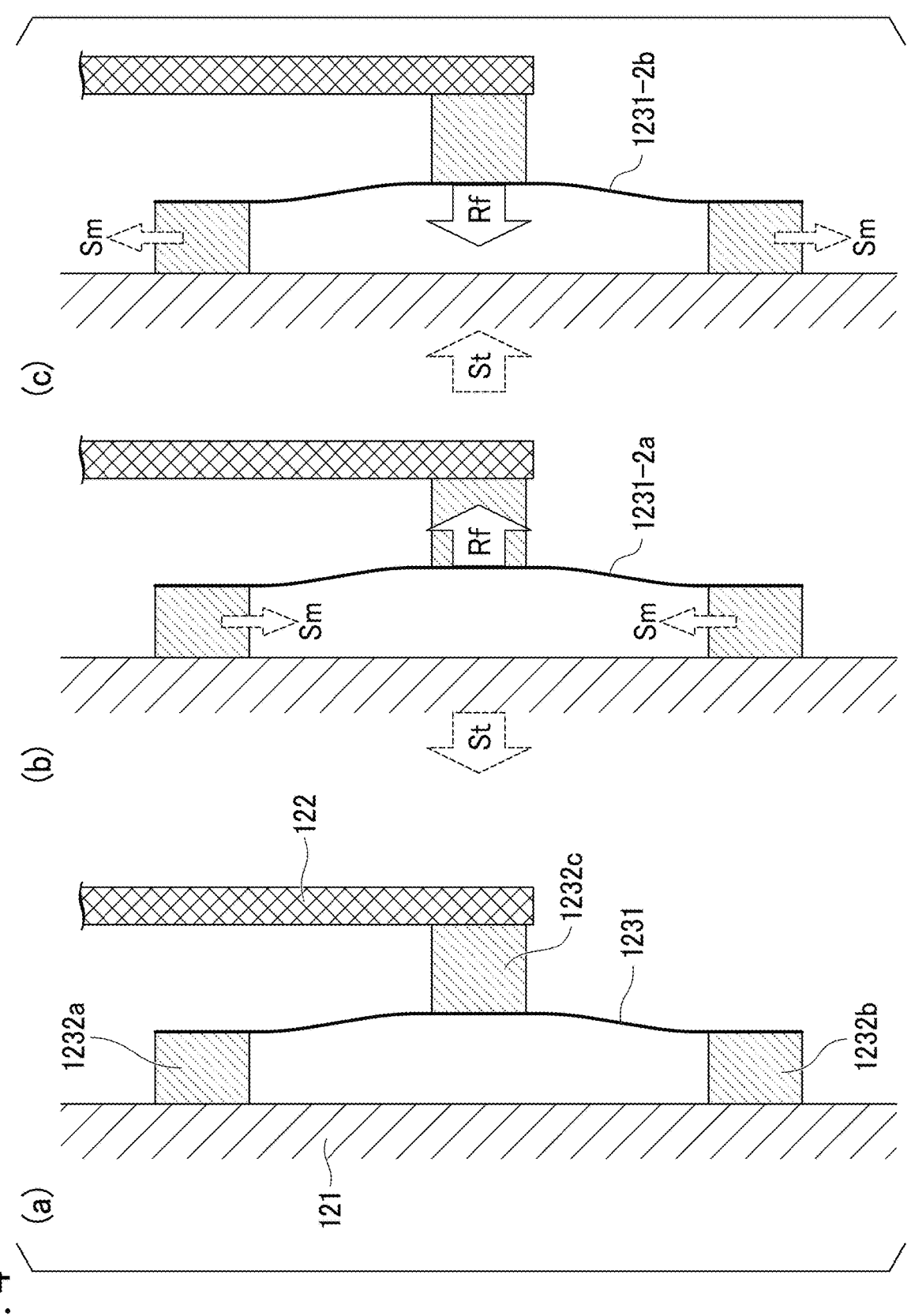
FIG. 4 is a diagram showing an example (part 2) of the structure of the thermal deformation cancellation mechanism that supports the superconducting coil in the superconducting magnet device according to the first embodiment.

Here, another structure of the thermal deformation cancellation mechanism 123 will be described. FIG. 4 is a diagram showing another example of the structure of the thermal deformation cancellation mechanism 123 that supports the superconducting coil 121 in the superconducting magnet device (static magnetic field magnet 12) according to the first embodiment. FIG. 4 also shows an example of the structure of the thermal deformation cancellation mechanism 123 located on the right side of FIG. 2 in the static magnetic field magnet 12 shown in FIG. 2, similar to the thermal deformation cancellation mechanism 123 in the first configuration shown in FIG. 3. FIG. 4(*a*) also shows an example of the structure of the thermal deformation cancellation mechanism 123, and FIG. 4(*b*) and FIG. 4(*c*) also show an example of the relationship between the thermal contraction St applied to the insulating load support 122 when the superconducting coil 121 has thermally deformed and the deformation Rf of the thermal deformation cancellation mechanism 123. More specifically, FIG. 4(*b*) shows an example of the relationship between the thermal contraction St and the deformation Rf of the thermal deformation cancellation mechanism 123 when the superconducting coil 121 has thermally contracted, and FIG. 4(*c*) shows an example of the relationship between the thermal contraction St and the deformation Rf of the thermal deformation cancellation mechanism 123 when the superconducting coil 121 has thermally expanded. In general, although it is considered that the material that constitutes (forms) the superconducting coil 121 thermally contracts when the inside of the vacuum vessel 120 is cooled to an extremely low temperature, when the superconducting coil 121 is formed of ultra-high molecular weight polyethylene such as Dyneema (registered trademark), for example, it is considered that the superconducting coil 121 thermally expands when the inside of the vacuum vessel 120 is cooled to an extremely low temperature.

First, the configuration of the thermal deformation cancellation mechanism 123 will be described with reference to FIG. 4(*a*). The thermal deformation cancellation mechanism 123 shown in FIG. 4(*a*) also includes a plate 1231, a fastening part 1232*a*, a fastening part 1232*b*, and a fastening part 1232*c*. The fastening parts 1232 included in the thermal deformation cancellation mechanism 123 shown in FIG. 4(*a*) are similar to the fastening parts 1232 included in the thermal deformation cancellation mechanism 123 shown in FIG. 3(*a*). Therefore, repeated description of the fastening parts 1232 included in the thermal deformation cancellation mechanism 123 shown in FIG. 4(*a*) will be omitted.

In the plate 1231 provided in the thermal deformation cancellation mechanism 123 shown in FIG. 4(*a*) is attached in such a manner that the plate 1231 having a curved shape with a central portion concave toward the side of the superconducting coil 121 in the thermal deformation cancellation mechanism 123 shown in FIG. 3(*a*) is upside down. In other words, in the thermal deformation cancellation mechanism 123 shown in FIG. 4(*a*), the plate 1231 has a curved shape with a central portion convex on the side opposite the superconducting coil 121. In the thermal deformation cancellation mechanism 123 shown in FIG. 4(*a*), the fastening parts 1232*a* and 1232*b* connect the opposing ends of the plate 1231 to the superconducting coil 121 such that the convex curved portion of the plate 1231 is convex on the side opposite the superconducting coil 121, and the fastening part 1232*c* connects the center of the curved portion of the plate 1231 to the insulating load support 122. The plate 1231 shown in FIG. 4(*a*) cancels out (offsets) deformation of the insulating load support 122 caused by thermal deformation occurring in the superconducting coil 121 by deforming in a direction opposite to the direction of thermal deformation of the superconducting coil 121 according to the temperature of the inside of the vacuum vessel 120 in which the plate 1231 is housed along with the superconducting coil 121. The coefficient of thermal expansion of the plate 1231 shown in FIG. 4(*a*) is also determined on the basis of a coefficient of thermal expansion ascertained in advance for each material that constitutes (forms) the superconducting coil 121, as in the plate 1231 provided in the thermal deformation cancellation mechanism 123 shown in FIG. 3(*a*), and a material that constitutes (forms) the plate 1231 shown in FIG. 4(*a*) is selected on the basis of the determined coefficient of thermal expansion.

Next, an example of the relationship between the thermal contraction St and the deformation Rf of the thermal deformation cancellation mechanism 123 when the superconducting coil 121 has thermally contracted when the inside of the vacuum vessel 120 has been cooled to an extremely low temperature will be described with reference to FIG. 4(*b*). Here, a plate 1231-2*a* shown in FIG. 4(*b*) has a coefficient of thermal expansion depending on the temperature of the inside of the vacuum vessel 120, which is less than the coefficient of thermal expansion of the superconducting coil 121.

When the superconducting coil 121 thermally contracts when the inside of the vacuum vessel 120 is cooled to an extremely low temperature, the fastening parts 1232*a* and 1232*b* are moved in a direction in which they approach each other, as shown by movement Sm in FIG. 4(*b*), even in the static magnetic field magnet 12 shown in FIG. 4. In the other hand, since the plate 1231 has a relatively smaller coefficient of thermal expansion than the superconducting coil 121, the convex curved shape is further pushed up and deformation Rf occurs toward the right side of FIG. 4(*b*). That is, in the thermal deformation cancellation mechanism 123 shown in FIG. 4, the thermal contraction St of the superconducting coil 121 relative to the insulating load support 122, which occurs when the inside of the vacuum vessel 120 is cooled to an extremely low temperature, is canceled out (offset), and the positional deviation of the superconducting coil 121 in the vacuum vessel 120 is reduced as in the thermal deformation cancellation mechanism 123 shown in FIG. 3.

Next, an example of the relationship between the thermal contraction St and the deformation Rf of the thermal deformation cancellation mechanism 123 when the superconducting coil 121 has thermally expanded when the inside of the vacuum vessel 120 has been cooled to an extremely low temperature will be described with reference to FIG. 4(*c*). Here, a plate 1231-2*a* shown in FIG. 4(*c*) has a positive coefficient of thermal expansion.

When the superconducting coil 121 thermally expands when the inside of the vacuum vessel 120 is cooled to an extremely low temperature, the fastening parts 1232*a* and 1232*b* are moved in a direction in which they become far away from each other as shown by movement Sm in FIG. 4(*c*) in the static magnetic field magnet 12 shown in FIG. 4. On the other hand, since the plate 1231 shown in FIG. 4(*c*) has a positive coefficient of thermal expansion, the plate 1231 thermally contracts in a direction in which the convex curved shape expands (a direction in which the convex curved portion tries to become concave and flat) when the inside of the vacuum vessel 120 is cooled to an extremely low temperature, causing deformation Rf toward the left side of FIG. 4(*c*). As a result, even in the static magnetic field magnet 12 connected to the insulating load support 122 by the thermal deformation cancellation mechanism 123 configured as shown in FIG. 4, the thermal contraction St of the superconducting coil 121 relative to the insulating load support 122, which occurs when the inside of the vacuum vessel 120 is cooled to an extremely low temperature, is canceled out (offset), and the positional deviation of the superconducting coil 121 in the vacuum vessel 120 is reduced.

(Third Configuration of Thermal Deformation Cancellation Mechanism)

Figure 5:
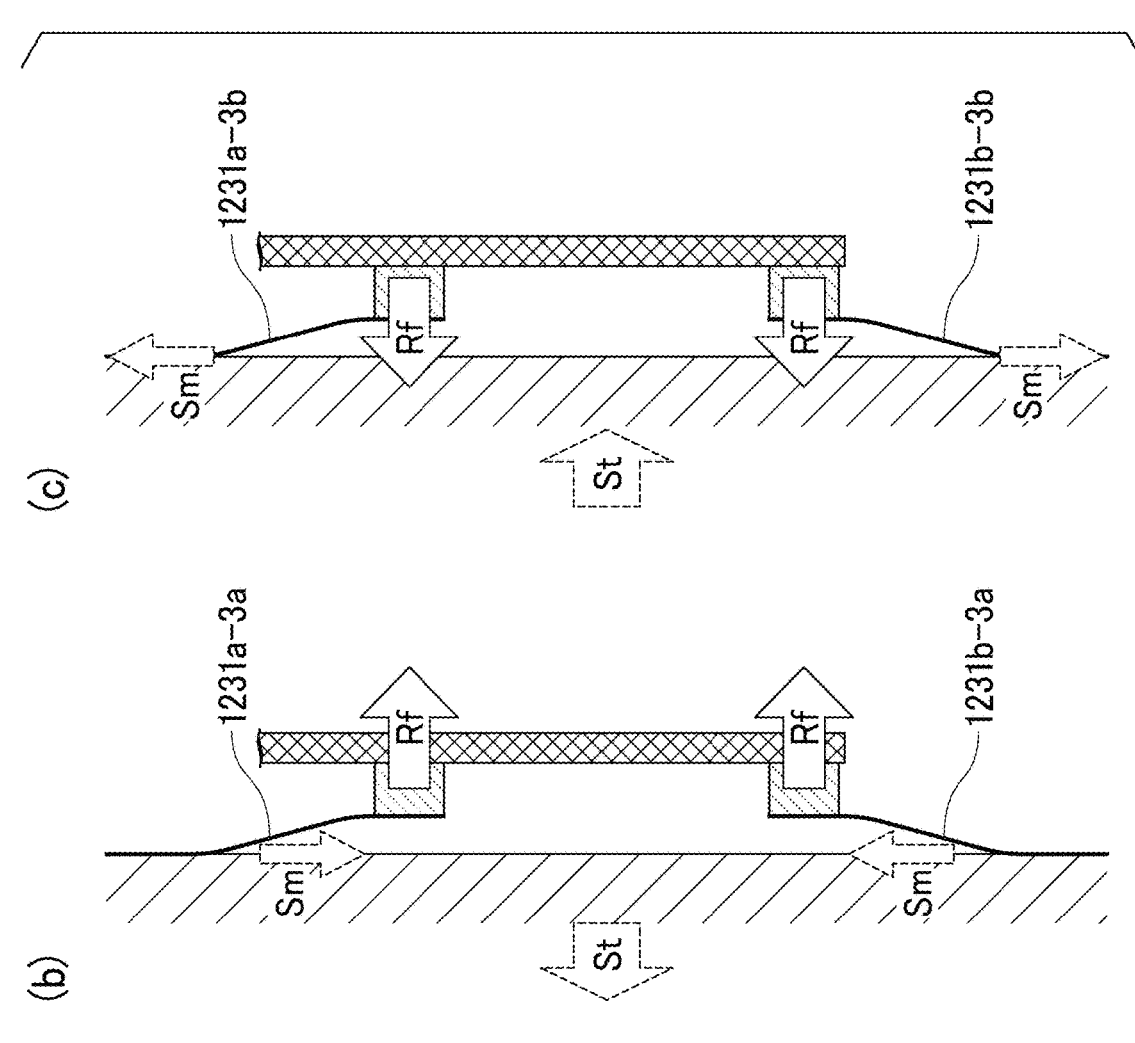
FIG. 5 is a diagram showing an example (part 3) of the structure of the thermal deformation cancellation mechanism that supports the superconducting coil in the superconducting magnet device according to the first embodiment.
Figure 5:
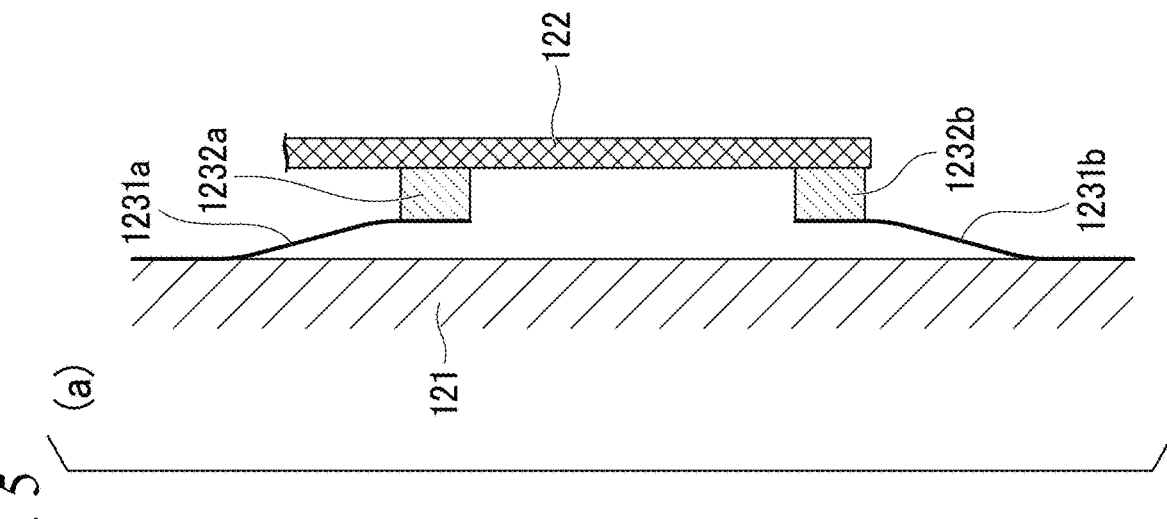

Here, another structure of the thermal deformation cancellation mechanism 123 will be described. FIG. 5 is a diagram showing another example of the structure of the thermal deformation cancellation mechanism 123 that supports the superconducting coil 121 in the superconducting magnet device (static magnetic field magnet 12) according to the first embodiment. FIG. 5 also shows an example of the structure of the thermal deformation cancellation mechanism 123 located on the right side of FIG. 2 in the static magnetic field magnet 12 shown in FIG. 2, similar to the thermal deformation cancellation mechanism 123 in the second configuration shown in FIG. 3 and FIG. 4. FIG. 5(*a*) also shows an example of the structure of the thermal deformation cancellation mechanism 123, and FIG. 5(*b*) and FIG. 5(*c*) also show an example of the relationship between thermal contraction St applied to the insulating load support 122 when the superconducting coil 121 has thermally deformed and deformation Rf of the thermal deformation cancellation mechanism 123. More specifically, FIG. 5(*b*) shows an example of the relationship between the thermal contraction St and the deformation Rf of the thermal deformation cancellation mechanism 123 when the superconducting coil 121 has thermally contracted, and FIG. 5(*c*) shows an example of the relationship between the thermal contraction St and the deformation Rf of the thermal deformation cancellation mechanism 123 when the superconducting coil 121 has thermally expanded.

First, the configuration of the thermal deformation cancellation mechanism 123 will be described with reference to FIG. 5(*a*). The thermal deformation cancellation mechanism 123 shown in FIG. 5(*a*) includes a plate 1231*a*, a plate 1231*b*, a fastening part 1232*a*, and a fastening part 1232*b*. In the thermal deformation cancellation mechanism 123 shown in FIG. 5(*a*), the fastening part 1232*a* connects the insulating load support 122 and the plate 1231*a*, and the fastening part 1232*b* connects the insulating load support 122 and the plate 1231*b*. The fastening parts 1232 are similar to the fastening parts 1232 included in the thermal deformation cancellation mechanism 123 shown in FIG. 3(*a*). Therefore, repeated description of the fastening parts 1232 included in the thermal deformation cancellation mechanism 123 shown in FIG. 5(*a*) will be omitted.

The thermal deformation cancellation mechanism 123 shown in FIG. 5(*a*) is different from the thermal deformation cancellation mechanism 123 shown in FIG. 3(*a*) and FIG. 4(*a*) in that the plate 1231 is divided into two, the plate 1231*a* and the plate 1231*b*. More specifically, the plate 1231 of the thermal deformation cancellation mechanism 123 shown in FIG. 5(*a*) has a shape in which the convex curved portion of the plate 1231 of the thermal deformation cancellation mechanism 123 shown in FIG. 4(*a*) is divided into two at a central dividing point. In other words, the plate 1231 of the thermal deformation cancellation mechanism 123 shown in FIG. 5(*a*) is formed into a curved shape having a curved portion with a central portion convex on the side opposite the superconducting coil 121 by a pair of plates 1231, the plate 1231*a* and the plate 1231*b*. In addition, in the configuration of the thermal deformation cancellation mechanism 123 shown in FIG. 5(*a*), the fastening part 1232*a* is connected to the end of the plate 1231*a* that corresponds to the central position divided into two, the fastening part 1232*b* is connected to the end of the plate 1231*b* that corresponds to the central position divided into two, and the fastening part 1232*a* and the fastening part 1232*b* are connected to the insulating load support 122. Furthermore, in the configuration of the thermal deformation cancellation mechanism 123 shown in FIG. 5(*a*), the ends of the plate 1231*a* and the plate 1231*b* on the side to which the corresponding fastening parts 1232 are not connected are directly connected to the superconducting coil 121. Here, direct connection of the ends of the plate 1231*a* and the plate 1231*b* on the side to which the fastening parts 1232 are not connected to the superconducting coil 121 is strongly connected to the superconducting coil 121 by, for example, a bolt or the like. In the following description, when there is no need to distinguish between the plate 1231*a* and the plate 1231*b*, they will simply be referred to as a "plate 1231."

The plate 1231 shown in FIG. 5(*a*) cancels out (offsets) deformation of the insulating load support 122 caused by thermal deformation occurring in the superconducting coil 121 caused by deformation of the end connected to the fastening part 1232 according to the temperature of the inside of the vacuum vessel 120 in which the plate 1231 shown in FIG. 5(*a*) is housed along with the superconducting coil 121. The coefficient of thermal expansion of the plate 1231 shown in FIG. 5(*a*) is determined on the basis of a coefficient of thermal expansion ascertained in advance for each material that constitutes (forms) the superconducting coil 121, as in the plate 1231 provided in the thermal deformation cancellation mechanism 123 shown in FIG.

3(*a*) and FIG. 4(*a*), and a material that constitutes (forms) the plate 1231 shown in FIG. 5(*a*) is selected on the basis of the determined coefficient of thermal expansion.

Next, an example of the relationship between the thermal contraction St and the deformation Rf of the thermal deformation cancellation mechanism 123 when the superconducting coil 121 has thermally contracted when the inside of the vacuum vessel 120 has been cooled to an extremely low temperature will be described with reference to FIG. 5(*b*). Here, a plate 1231*a*-3*a* and a plate 1231*b*-3*a* shown in FIG. 5(*b*) have a coefficient of thermal expansion depending on the temperature of the inside of the vacuum vessel 120, which is less than the coefficient of thermal expansion of the superconducting coil 121.

When the superconducting coil 121 thermally contracts when the inside of the vacuum vessel 120 is cooled to an extremely low temperature, the fastening parts 1232*a* and 1232*b* are moved in a direction in which they approach each other, as shown by movement Sm in FIG. 5(*b*), similar to FIG. 3(*b*) and FIG. 4(*b*), in the static magnetic field magnet 12 shown in FIG. 5. Accordingly, deformation Rf toward the right side of FIG. 5(*b*) occurs in the plate 1231*a* and the plate 1231*b* shown in FIG. 5(*b*). As a result, even in the static magnetic field magnet 12 connected to the insulating load support 122 by the thermal deformation cancellation mechanism 123 configured as shown in FIG. 5, the thermal contraction St of the superconducting coil 121 relative to the insulating load support 122, which occurs when the inside of the vacuum vessel 120 is cooled to an extremely low temperature, is canceled out (offset), and the positional deviation of the superconducting coil 121 in the vacuum vessel 120 is reduced.

Next, an example of the relationship between the thermal contraction St and deformation Rf of thermal deformation cancellation mechanism 123 when the superconducting coil 121 has thermally expanded when the inside of vacuum vessel 120 has been cooled to an extremely low temperature will be described with reference to FIG. 5(*c*). Here, each of the plate 1231*a*-3*b* and the plate 1231*b*-3*b* shown in FIG. 5(*c*) has a positive coefficient of thermal expansion.

When the superconducting coil 121 thermally expands when the inside of the vacuum vessel 120 is cooled to an extremely low temperature, the fastening parts 1232*a* and 1232*b* are moved in a direction in which they become far away from each other, as shown by movement Sm in FIG. 5(*c*) in the static magnetic field magnet 12 shown in FIG. 5, as in FIG. 4(*c*). Accordingly, deformation Rf toward the left side of FIG. 5(*c*) occurs in the plate 1231*a* and the plate 1231*b* shown in FIG. 5(*c*). As a result, even in the static magnetic field magnet 12 connected to the insulating load support 122 by the thermal deformation cancellation mechanism 123 configured as shown in FIG. 5, the thermal contraction St of the superconducting coil 121 relative to the insulating load support 122, which occurs when the inside of the vacuum vessel 120 is cooled to an extremely low temperature, is canceled out (offset), and the positional deviation of the superconducting coil 121 in the vacuum vessel 120 is reduced.

As described above, in the static magnetic field magnet 12 of the first embodiment, the superconducting coil 121 and the insulating load support 122 are connected by the thermal deformation cancellation mechanism 123 inside the vacuum vessel 120. In addition, in the static magnetic field magnet 12 of the first embodiment, the thermal deformation cancellation mechanism 123 generates deformation Rf in a direction in which thermal contraction St that occurs in the superconducting coil 121 when the inside of the vacuum vessel 120 is cooled to an extremely low temperature is canceled out (offset). Accordingly, the positional deviation of the superconducting coil 121 inside the vacuum vessel 120 is reduced.

Second Embodiment

Figure 6:
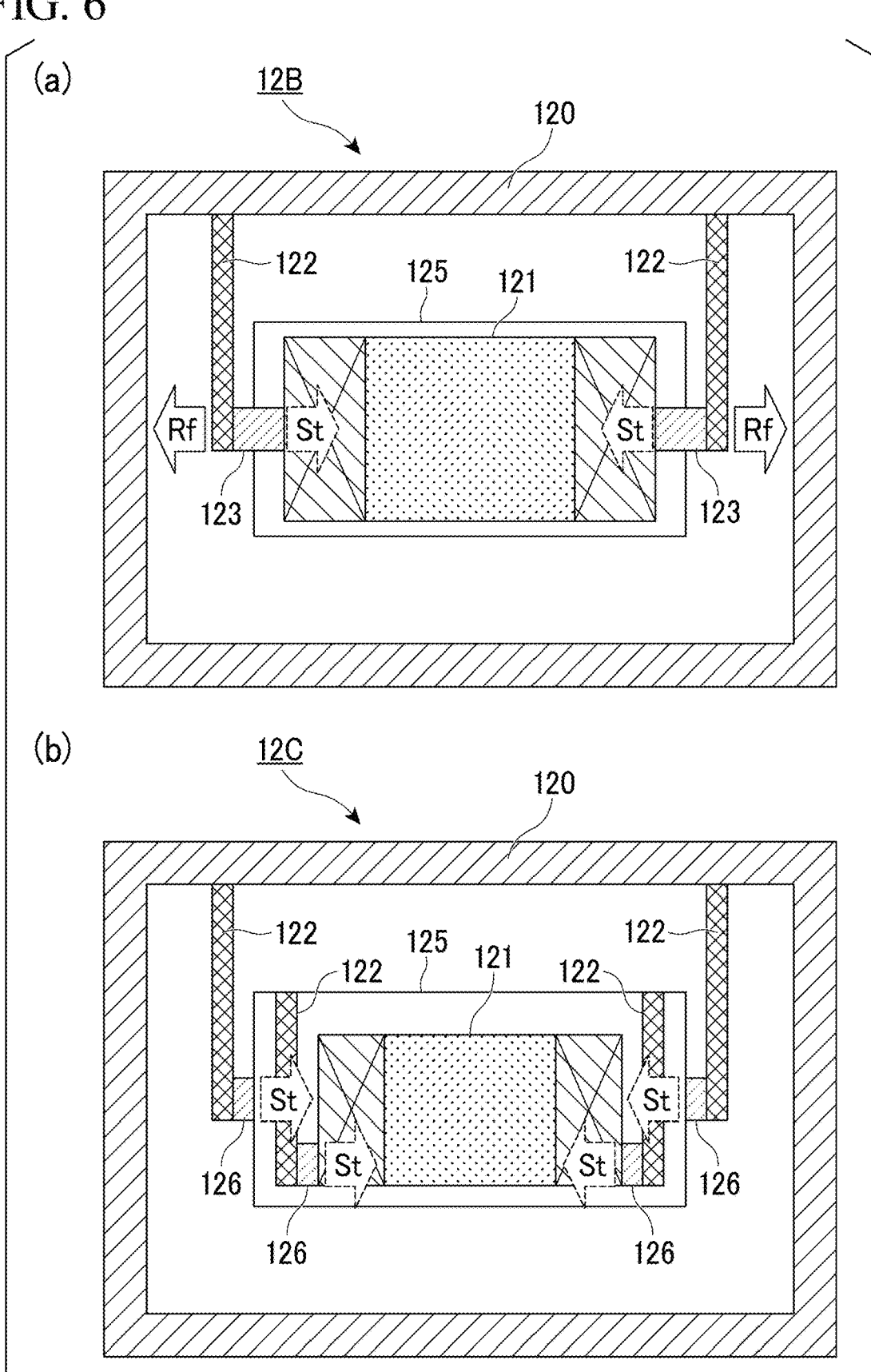
FIG. 6 is a diagram showing an example of a configuration of a superconducting magnet device according to a second embodiment.

In the static magnetic field magnet 12, the superconducting coil 121 may be housed in the vacuum vessel 120 while being housed in a radiation shield. The configuration of the static magnetic field magnet 12 in this case and a structure that supports the superconducting coil in the static magnetic field magnet 12 will be described below. FIG. 6 is a diagram showing an example of a configuration of a superconducting magnet device (static magnetic field magnet 12) according to a second embodiment. FIG. 6 shows a schematic configuration of the static magnetic field magnet 12 in which the superconducting coil 121 housed in a radiation shield 125 inside the vacuum vessel 120 is supported by being suspended from above by the insulating load support 122. FIG. 6(*a*) shows a schematic configuration of the static magnetic field magnet 12 of the second embodiment, in which the superconducting coil 121 housed in the radiation shield 125 inside the vacuum vessel 120 is supported by being suspended from above by the insulating load support 122, and FIG. 6(*b*) shows, for reference, a schematic configuration of a conventional static magnetic field magnet 12, in which the superconducting coil 121 housed in the radiation shield 125 is supported inside the vacuum vessel 120.

The components of the static magnetic field magnet 12 shown in FIG. 6 include components similar to those of the static magnetic field magnet 12 of the first embodiment. Therefore, in the following description, the same reference numerals are given to components similar to those of the static magnetic field magnet 12 of the first embodiment, and a repeated detailed description thereof will be omitted. In the following description, in order to distinguish between the static magnetic field magnet 12 of the first embodiment, the static magnetic field magnet 12 of the second embodiment, and the static magnetic field magnet 12 of the conventional configuration, the static magnetic field magnet 12 of the first embodiment will be referred to as a "static magnetic field magnet 12A," the static magnetic field magnet 12 of the second embodiment will be referred to as a "static magnetic field magnet 12B," and the static magnetic field magnet 12 of the conventional configuration will be referred to as a "static magnetic field magnet 12C."

First, for comparison, the configuration of the static magnetic field magnet 12C shown in FIG. 6(*b*) will be described. In a case where the superconducting coil is supported in the vacuum vessel while being housed in the radiation shield in the conventional static magnetic field magnet configuration, a configuration in which insulating load supports 122 disposed at two locations in the radiation shield 125 are connected to the superconducting coil 121 by fastening parts 126, and further, the respective insulating load supports 122 disposed at two locations in the vacuum vessel 120 are connected to the radiation shield 125 by fastening parts 126, as shown in FIG. 6(*b*), is conceivable. In this configuration, the superconducting coil 121 and the radiation shield 125 thermally deform when the inside of the vacuum vessel 120 is cooled to an extremely low temperature, and stress caused by thermal contraction St is applied to each insulating load support 122. FIG. 6(*b*) shows an example of a state in which stress caused by the thermal contraction St is applied to each insulating load support 122 due to thermal contraction (shrinking of the external shapes)

of the superconducting coil 121 and the radiation shield 125 in an extremely low temperature environment.

On the other hand, in the static magnetic field magnet 12B, as shown in FIG. 6(*a*), insulating load supports 122 disposed at two locations in the vacuum vessel 120 support the superconducting coil 121 and the radiation shield 125 via the thermal deformation cancellation mechanism 123. In addition, in the static magnetic field magnet 12B, the thermal deformation cancellation mechanism 123 also deforms in a direction in which thermal deformation of the superconducting coil 121 and the radiation shield 125 is canceled out (offset) as in the static magnetic field magnet 12A, and thus no stress acts on the insulating load supports 122. FIG. 6(*a*) shows an example of a state in which stress caused by thermal contraction St is applied to the insulating load supports 122 due to thermal contraction (shrinking of the external shapes) of the superconducting coil 121 and the radiation shield 125 in an extremely low temperature environment. FIG. 6(*a*) also shows an example of a state in which the thermal deformation cancellation mechanism 123 applies deformation Rf to the side opposite the thermal contraction St, causing no stress to be generated in the insulating load supports 122. As a result, in the static magnetic field magnet 12B, the positional deviation of the superconducting coil 121 and the radiation shield 125 in the vacuum vessel 120 is reduced, as in the static magnetic field magnet 12A.

(Configuration of Thermal Deformation Cancellation Mechanism)

Figure 7:
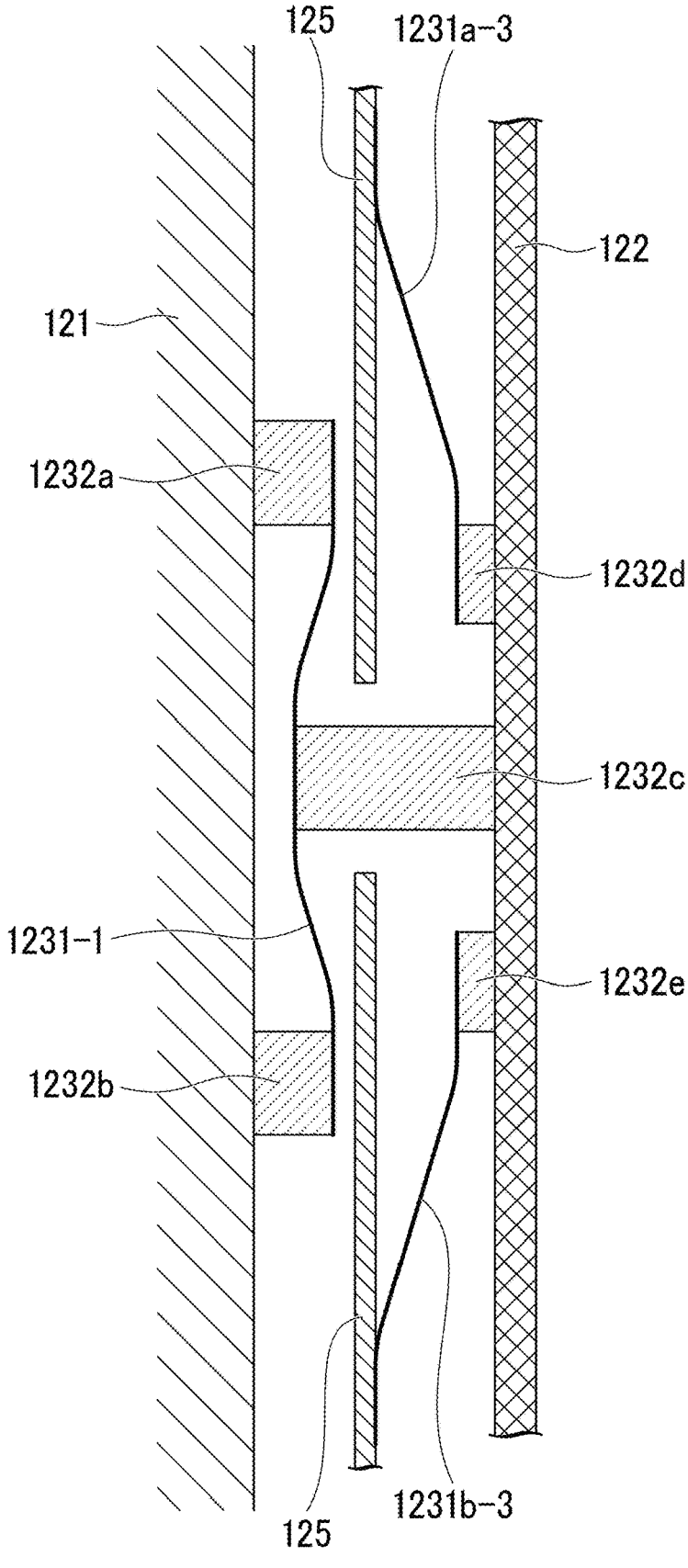
FIG. 7 is a diagram showing an example of a structure of a thermal deformation cancellation mechanism that supports a superconducting coil in the superconducting magnet device according to the second embodiment.

Here, the structure of the thermal deformation cancellation mechanism 123 provided in the static magnetic field magnet 12B will be described. FIG. 7 is a diagram showing an example of the structure of the thermal deformation cancellation mechanism 123 that supports the superconducting coil 121 (including the radiation shield 125) in the superconducting magnet device (static magnetic field magnet 12B) according to the second embodiment. FIG. 7 shows an example of the structure of the thermal deformation cancellation mechanism 123 located on the right side of FIG. 6 in the static magnetic field magnet 12B shown in FIG. 6.

The thermal deformation cancellation mechanism 123 includes a plate 1231-1, a plate 1231*a*-3, a plate 1231*b*-3, a fastening part 1232*a*, a fastening part 1232*b*, a fastening part 1232*c*, a fastening part 1232*d*, and a fastening part 1232*e*. In the following description, when there is no need to distinguish between the fastening parts 1232*b*, 1232*c*, 1232*d*, and 1232*e*, they will simply be referred to as "fastening parts 1232."

The plate 1231-1 is similar to the plate 1231 having a curved shape with a central portion concave toward the superconducting coil 121, which is provided in the thermal deformation cancellation mechanism 123 of the static magnetic field magnet 12A in the first configuration shown in FIG. 3. More specifically, the plate 1231-1 is similar to the plate 1231-1*a* shown in FIG. 3(*b*). The plate 1231*a*-3 and the plate 1231*b*-3 are similar to the plate 1231*a* and the plate 1231*b*, which are configured to be divided into two, respectively, provided in the thermal deformation cancellation mechanism 123 of the static magnetic field magnet 12A in the third configuration shown in FIG. 5. More specifically, the plate 1231*a*-3 and the plate 1231*b*-3 are similar to the plate 1231*a*-3*a* and the plate 1231*b*-3*a* shown in FIG. 5(*b*) or the plate 1231*a*-3*b* and the plate 1231*b*-3*b* shown in FIG. 5(*c*). Therefore, a repeated description of each plate 1231 provided in the thermal deformation cancellation mechanism 123 shown in FIG. 7 will be omitted.

Each of the fastening parts 1232 are similar to each of the fastening parts 1232 provided in the thermal deformation cancellation mechanism 123 of the static magnetic field magnet 12A in the first embodiment shown in FIG. 3 to FIG. 5. However, in the thermal deformation cancellation mechanism 123 shown in FIG. 7, the fastening part 1232*a* and the fastening part 1232*b* connect the superconducting coil 121 and the plate 1231-1, the fastening part 1232*c* connects the insulating load support 122 and the plate 1231-1, the fastening part 1232*d* connects the insulating load support 122 and the plate 1231*a*-3, and the fastening part 1232*e* connects the insulating load support 122 and the plate 1231*b*-3.

With this configuration, the thermal deformation cancellation mechanism 123 connects the superconducting coil 121 and the radiation shield 125 to the corresponding insulating load supports 122 in the static magnetic field magnet 12B. In addition, in the thermal deformation cancellation mechanism 123 provided in the static magnetic field magnet 12B, the plate 1231-1, the fastening part 1232*a*, the fastening part 1232*b*, and the fastening part 1232*c* are configured to generate deformation Rf in a direction in which thermal contraction St that occurs in the superconducting coil 121 when the inside of the vacuum vessel 120 is cooled to an extremely low temperature is canceled out (offset). Furthermore, in the thermal deformation cancellation mechanism 123 provided in the static magnetic field magnet 12B, the plate 1231*a*-3, the plate 1231*b*-3, the fastening part 1232*d*, and the fastening part 1232*e* are configured to generate deformation Rf in a direction in which thermal contraction St that occurs in the radiation shield 125 when the inside of the vacuum vessel 120 is cooled to an extremely low temperature is canceled out (offset). At this time, the deformations Rf generated by the thermal deformation cancellation mechanism 123 only need to correspond to the thermal contraction St generated by the superconducting coil 121 and the thermal contraction St generated by the radiation shield 125, and do not necessarily have the same magnitude. As a result, even in the static magnetic field magnet 12B, the thermal contraction St of the superconducting coil 121 and the radiation shield 125 relative to the insulating load support 122 which occurs when the inside of the vacuum vessel 120 is cooled to an extremely low temperature is cancelled (offset), and the positional deviation of the superconducting coil 121 and the radiation shield 125 in the vacuum vessel 120 is reduced.

FIG. 7 shows the structure of the thermal deformation cancellation mechanism 123 that connects the superconducting coil 121 and the radiation shield 125 to the corresponding insulating load supports 122 by combining the structures of the thermal deformation cancellation mechanisms 123 in the static magnetic field magnet 12A in the first configuration shown in FIG. 3 and the static magnetic field magnet 12A in the third configuration shown in FIG. 5. However, the structure of the thermal deformation cancellation mechanism 123 that connects the superconducting coil 121 and the radiation shield 125 to the corresponding insulating load supports 122 is not limited to the structure shown in FIG. 7. That is, the combined structure in the thermal deformation cancellation mechanism 123 that connects the superconducting coil 121 and the radiation shield 125 to the corresponding insulating load supports 122 may be a structure that combines the structures of any of the thermal deformation cancellation mechanisms 123 of the static magnetic field magnet 12A of the first embodiment shown in FIG. 3 to FIG. 5.

In the thermal deformation cancellation mechanism 123 shown in FIG. 7, the plate 1231-1 is an example of a "first thermal deformation member." In the thermal deformation cancellation mechanism 123 shown in FIG. 7, the plate 1231*a*-3 and the plate 1231*b*-3 are an example of a "second thermal deformation member."

The relationship between the thermal contraction St and the deformation Rf of the thermal deformation cancellation mechanism 123 when the superconducting coil 121 or the radiation shield 125 thermally contracts or expands when the inside of the vacuum vessel 120 is cooled to an extremely low temperature can be easily conceived on the basis of an example of the relationship between the thermal contraction St and the deformation Rf in the thermal deformation cancellation mechanism 123 of the static magnetic field magnet 12A of the first embodiment, described using FIG. 3 to FIG. 5. Therefore, a detailed description of the example of the relationship between the thermal contraction St and the deformation Rf in the thermal deformation cancellation mechanism 123 of the static magnetic field magnet 12B will be omitted.

As described above, in the static magnetic field magnet 12B of the second embodiment, the superconducting coil 121 and the radiation shield 125 are connected to the insulating load support 122 by the thermal deformation cancellation mechanism 123 in the vacuum vessel 120. In addition, in the static magnetic field magnet 12B of the second embodiment, the thermal deformation cancellation mechanism 123 generates deformation Rf in a direction in which the thermal contraction St that occurs in the superconducting coil 121 and the radiation shield 125 when the inside of the vacuum vessel 120 is cooled to an extremely low temperature is canceled out (offset). As a result, in the static magnetic field magnet 12B of the second embodiment, even if the superconducting coil 121 and the radiation shield 125 thermally deform when the inside of the vacuum vessel 120 is cooled to an extremely low temperature, the thermal deformation of the insulating load support 122 is canceled out (offset), and the positional deviation of the superconducting coil 121 and the radiation shield 125 in the vacuum vessel 120 is reduced.

Furthermore, in the static magnetic field magnet 12B of the second embodiment, each of the superconducting coil 121 and the radiation shield 125 is connected to the corresponding insulating load support 122 by a single thermal deformation cancellation mechanism 123. Therefore, the static magnetic field magnet 12B of the second embodiment has a configuration that is more resistant to vibration of the superconducting coil 121 than the conventional static magnetic field magnet 12C as shown in FIG. 6(*b*). The vibration of the superconducting coil 121 includes, for example, vibration generated in the superconducting coil 121 itself when a strong static magnetic field is generated, and vibration applied to the superconducting coil 121 from the outside. The vibration generated in the superconducting coil 121 itself includes, for example, vibration generated when a strong static magnetic field is generated by receiving power from the static magnetic field power supply 32, and vibration generated by interaction between a static magnetic field generated by the superconducting coil 121 and a gradient magnetic field (which can also be said to be an alternating magnetic field because the magnetic field strength changes along each of the X-axis, Y-axis, and Z-axis) generated by the gradient magnetic field coil 14. The vibration applied to the superconducting coil 121 from the outside includes, for example, vibration applied when the MRI apparatus 1 is transported to be installed in a medical facility.

Third Embodiment

Figure 8:
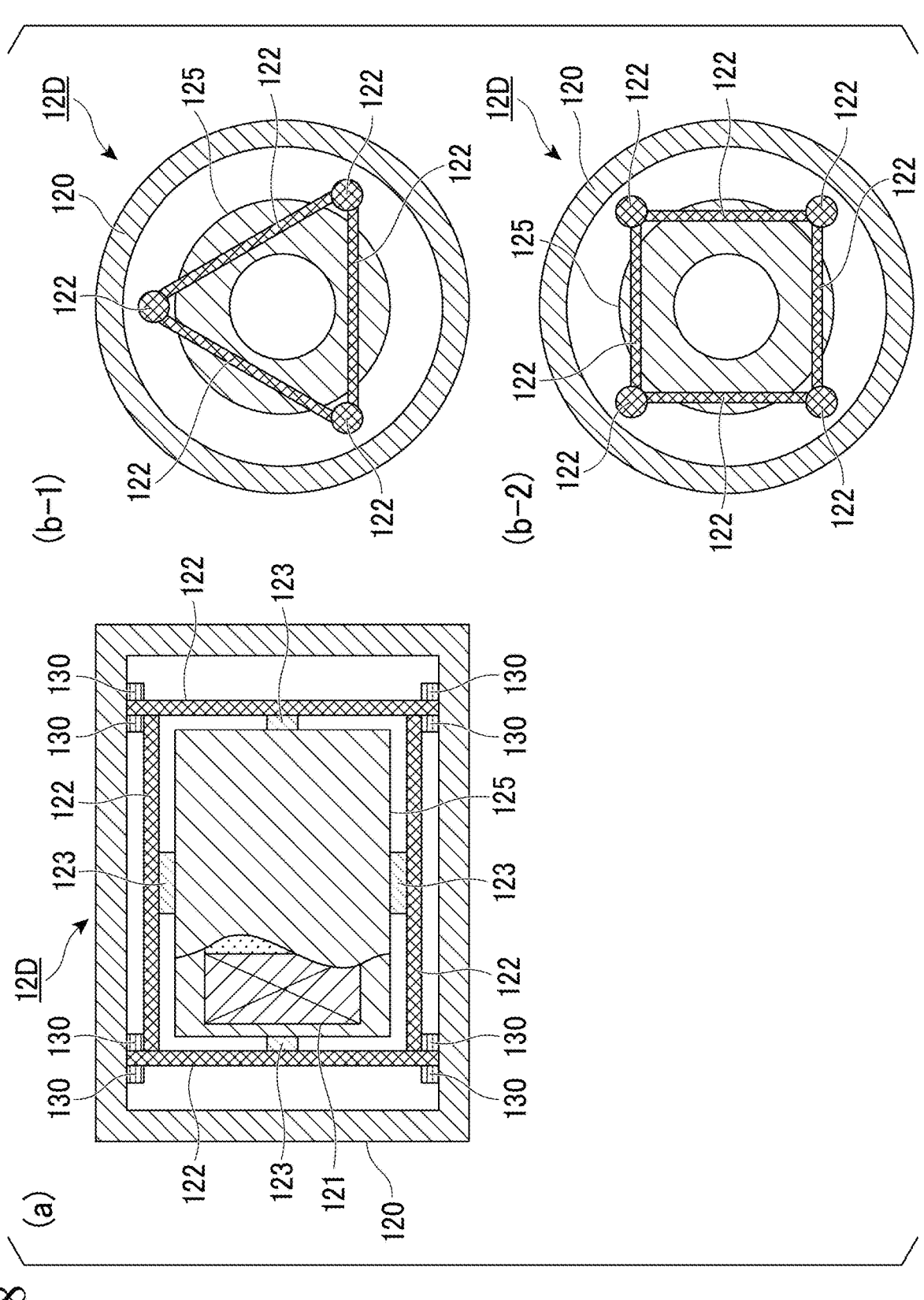
FIG. 8 is a diagram showing an example of a configuration that supports a superconducting coil in a superconducting magnet device according to an embodiment.

In the first and second embodiments, the static magnetic field magnet 12 having a configuration in which the superconducting coil 121 is housed in the vacuum vessel 120 by being suspended from above by the insulating load support 122 has been shown and described. However, in practice, it is preferable to support the superconducting coil 121 in a plurality of directions within the vacuum vessel 120, including increasing the resistance of the superconducting coil 121 to vibration in the static magnetic field magnet 12. A configuration of the static magnetic field magnet 12 in this case will be described below. FIG. 8 is a diagram showing an example of a configuration for supporting the superconducting coil 121 in a superconducting magnet device (static magnetic field magnet 12) according to an embodiment. FIG. 8(*a*) shows an example of a static magnetic field magnet 12 configured to support the superconducting coil 121 in a plurality of directions in the vacuum vessel 120. In FIG. 8(*a*), the superconducting coil 121 (superconducting coil 121 housed in a radiation shield 125) having the same configuration as the static magnetic field magnet 12B shown in FIG. 6(*a*) is supported to be surrounded in a vacuum vessel 120 in a plurality of directions. FIG. 8(*b*-1) and FIG. (*b*-2) show examples of the static magnetic field magnet 12 having the configuration shown in FIG. 8(*a*) viewed in a direction in which the subject P is introduced into the MRI apparatus 1 (the Y-axis direction in FIG. 1). In the following description, the static magnetic field magnet 12 having the configuration shown in FIG. 8 is referred to as a "static magnetic field magnet 12D." In the following description, the superconducting coil 121 housed in the radiation shield 125 contained in the vacuum vessel 120 in the static magnetic field magnet 12D is simply referred to as a "superconducting coil 121."

In the static magnetic field magnet 12D, the insulating load supports 122 are disposed in the vacuum vessel 120 in the vertical direction in FIG. 8(*a*) (Z-axis direction in FIG. 1) and the horizontal direction in FIG. 8(*a*) (Y-axis direction in FIG. 1), as shown in FIG. 8(*a*). In this case, in the static magnetic field magnet 12D, the insulating load supports 122 in the horizontal direction in FIG. 8(*a*) may be disposed to form a triangle on the end side of the superconducting coil 121 (for example, side of the introduction port of the subject P) as shown in FIG. 8 (*b*-1), that is, to form a triangular prism surrounding the superconducting coil 121. In the static magnetic field magnet 12D, the insulating load supports 122 in the horizontal direction in FIG. 8(*a*) may be disposed to form a rectangle (for example, a square) on the end side of the superconducting coil 121 as shown in FIG. 8(*b*-2), that is, to form a rectangular parallelepiped surrounding the superconducting coil 121.

In the static magnetic field magnet 12D, the disposed insulating load supports 122 are fastened to the inside of the vacuum vessel 120 by fastening parts 130, as shown in FIG. 8(*a*). That is, in the static magnetic field magnet 12D, both ends of each insulating load support 122 are fastened to the inside of the vacuum vessel 120 by the fastening parts 130. In FIG. 8(*b*-1) and FIG. 8(*b*-2), the insulating load supports 122 are fastened to the inside of the vacuum vessel 120 by the fastening parts 130 at the vertices of the triangle or the rectangle. The fastening parts 130 are parts for connecting the vacuum vessel 120 and the insulating load supports 122. The fastening parts 130 may be the same as or different from the fastening parts 1232 provided in the thermal deformation cancellation mechanism 123 of the static magnetic field magnet 12A of the first embodiment shown in FIG. 3 to FIG. 5 and the static magnetic field magnet 12B of the second embodiment shown in FIG. 7.

In addition, in the static magnetic field magnet 12D, the superconducting coil 121 is connected to each of the insulating load supports 122 disposed (fastened) in the vacuum vessel 120 via the thermal deformation cancellation mechanism 123, as shown in FIG. 8(*a*). The structure of the thermal deformation cancellation mechanism 123 in this case, that is, the combination of the shape of the plate 1231 and the arrangement of the fastening parts 1232, may be equivalent to the structure of the thermal deformation cancellation mechanism 123 shown in FIG. 7. That is, the combination of the shape of the plate 1231 and the arrangement of the fastening parts 1232 in the thermal deformation cancellation mechanism 123 shown in FIG. 8(*a*) may be a combination of the shape of the plate 1231 and the arrangement of the fastening parts 1232 in any of the thermal deformation cancellation mechanisms 123 of the static magnetic field magnet 12A of the first embodiment shown in FIG. 3 to FIG. 5.

With this configuration, in the static magnetic field magnet 12D, a plurality of insulating load supports 122 are disposed to surround the superconducting coil 121 (including the radiation shield 125) inside the vacuum vessel 120, and the thermal deformation cancellation mechanism 123 connecting each insulating load support 122 to the superconducting coil 121 generates deformation Rf in a direction in which thermal contraction St that occurs in the superconducting coil 121 (including the radiation shield 125) when the inside of the vacuum vessel 120 is cooled to an extremely low temperature is canceled out (offset). Accordingly, the positional deviation of the superconducting coil 121 (including the radiation shield 125) inside the vacuum vessel 120 is reduced.

Moreover, in the static magnetic field magnet 12D, the plurality of insulating load supports 122 are disposed to surround and support the superconducting coil 121 (including the radiation shield 125) in a plurality of directions inside the vacuum vessel 120. Accordingly, in the static magnetic field magnet 12D, resistance to vibrations that occur when the superconducting coil 121 generates a strong static magnetic field and vibrations that are applied to the superconducting coil 121 from the outside can be increased.

Although FIG. 8(*a*) shows the static magnetic field magnet 12D in a configuration in which all the insulating load supports 122 are connected to the superconducting coil 121 via the thermal deformation cancellation mechanism 123, this is merely an example, and connection to the superconducting coil 121 via the thermal deformation cancellation mechanism 123 may be omitted in any of the insulating load supports 122 included in the static magnetic field magnet 12D as long as the configuration can increase the resistance to vibrations. That is, the present invention is not limited to a configuration in which all the insulating load supports 122 are connected to the superconducting coil 121 via the thermal deformation cancellation mechanism 123. For example, in the example shown in FIG. 8(*b*-1) or FIG. 8(*b*-2), connection to the superconducting coil 121 via the thermal deformation cancellation mechanism 123 may be omitted in the insulating load supports 122 disposed at positions at which they form a triangle or a rectangle. In other words, in the example shown in FIG. 8(*b*-1) or FIG. 8(*b*-2), only the insulating load supports 122 that are disposed in the depth direction in the figure (the Y-axis direction in FIG. 1) at the vertex position of the triangle or rectangle (the insulating load supports 122 disposed in the horizontal direction in FIG. 8(*a*)) may be connected to the superconducting coil 121 via the thermal deformation cancellation mechanism 123.

As described above, in the static magnetic field magnet 12D of the third embodiment, a plurality of insulating load supports 122 are disposed in the vacuum vessel 120 to surround the superconducting coil 121 (including the radiation shield 125), and the superconducting coil 121 (including the radiation shield 125) is connected via the thermal deformation cancellation mechanism 123 corresponding to each of the insulating load supports 122, and thus thermal deformation of the insulating load supports 122 when the inside of the vacuum vessel 120 is cooled to an extremely low temperature can be canceled out (offset) and the resistance of the superconducting coil 121 (including the radiation shield 125) to vibrations can be increased.

As described above, in the superconducting magnet device (static magnetic field magnet 12) of the embodiment, the thermal deformation cancellation mechanism 123 that connects the superconducting coil 121 (which may include the radiation shield 125) housed in the vacuum vessel 120 to the insulating load supports 122 that support the superconducting coil 121 generates the deformation Rf in a direction in which the thermal contraction St due to thermal deformation that occurs in the superconducting coil 121 when the inside of the vacuum vessel 120 is cooled to an extremely low temperature is canceled out (offset). Accordingly, the positional deviation of the superconducting coil 121 in the vacuum vessel 120 can be reduced.

Moreover, in the superconducting magnet device (static magnetic field magnet 12) of the embodiment, a plurality of insulating load supports 122 are disposed in the vacuum vessel 120, and the superconducting coil 121 (which may include the radiation shield 125) is connected via the thermal deformation cancellation mechanism 123 corresponding to each of the insulating load supports 122, thereby making it possible to increase the resistance to vibrations in the superconducting magnet device.

As a result, the magnetic resonance imaging apparatus (MRI apparatus 1) using the superconducting magnet device of the embodiment can capture more suitable tomographic images (MR images) of the subject P, making it possible to more smoothly diagnose and examine the subject P.

In the above-described embodiments, cases in which the superconducting magnet device (static magnetic field magnet 12) is formed in a hollow and approximately cylindrical shape and used in the MRI apparatus 1 having a configuration in which an imaging portion of the subject P is moved into the cavity of the static magnetic field magnet 12, the gradient magnetic field coil 14, and the RF coil 16, that is, into the imaging port (bore) of the gantry device 10, thereby capturing a tomographic image (MR image) of the subject P have been described. However, the shape of the superconducting magnet device used in the MRI apparatus may be a shape other than a hollow and approximately cylindrical shape. For example, an MRI apparatus having a configuration in which two separate superconducting magnet devices are provided and a strong static magnetic field is generated with the superconducting magnet devices sandwiching the subject P to capture a tomographic image (MR image) is conceivable. In an MRI apparatus having such a configuration, the same configuration as the superconducting magnet device of the embodiments may also be adopted. That is, as in the superconducting magnet device of the embodiments, thermal deformation applied to the insulating load support from the superconducting coil (which may include a radiation shield) that has thermally deformed when the inside of the vacuum vessel has been cooled to an extremely low temperature is canceled out (offset) by a thermal deformation cancellation mechanism that connects the superconducting coil and the insulating load support that supports the superconducting coil in the vacuum vessel, thereby reducing the positional deviation of the superconducting coil in the vacuum vessel. In this case, the configurations of the superconducting magnet device or the magnetic resonance imaging apparatus and the structure of the thermal deformation cancellation mechanism may be equivalent to the configurations of the superconducting magnet device and the magnetic resonance imaging apparatus and the structure of the thermal deformation cancellation mechanism of the above-mentioned embodiments. Therefore, detailed descriptions of the configurations of the superconducting magnet device and the magnetic resonance imaging apparatus and the structure of the thermal deformation cancellation mechanism in cases in which the shape of the superconducting magnet device used in the MRI apparatus is other than a hollow and approximately cylindrical shape will be omitted.

Although examples of cases in which the superconducting magnet device (static magnetic field magnet 12) is used in a magnetic resonance imaging apparatus (MRI apparatus 1) have been described in the aforementioned embodiments, this is merely an example, and apparatuses or systems in which the superconducting magnet device of the embodiments is used is not limited to a magnetic resonance imaging apparatus as long as the superconducting magnet device is used in any apparatus or system. For example, the superconducting magnet device of the embodiments may be applied to apparatuses or systems in fields other than the medical field, such as linear motor cars. In this case, the configuration of the superconducting magnet device and the structure of the thermal deformation cancellation mechanism may also be equivalent to the configuration of the superconducting magnet device and the structure of the thermal deformation cancellation mechanism of the above embodiments. Therefore, a detailed description of the configuration of the superconducting magnet device and the structure of the thermal deformation cancellation mechanism in this case will be omitted.

According to at least one of the embodiments described above, it is possible to provide a structure in which a load is not generated on a load support (insulating load support) due to thermal deformation of a superconducting coil housed in a vacuum vessel by providing a superconducting magnet device (static magnetic field magnet 12) comprising a superconducting coil, an insulating load support, a vacuum vessel, and a thermal deformation cancellation mechanism, at least the superconducting coil (121) being housed in the vacuum vessel (120) in a state in which the superconducting coil is supported by the insulating load support (122), wherein the insulating load support is configured to support support the superconducting coil via the thermal deformation cancellation mechanism, the thermal deformation cancellation mechanism being configured to generate a second deformation amount (deformation Rf) in a direction in which a first deformation amount (thermal contraction St) applied from the superconducting coil to the insulating load support is canceled out due to thermal deformation occurring in the superconducting coil when the inside of the vacuum vessel is cooled to an extremely low temperature, and the thermal deformation cancellation mechanism includes a thermal deformation member (plate 1231) that includes at least a material having a second coefficient of thermal expansion determined on the basis of a first coefficient of thermal expansion of a material forming the superconducting coil, and the thermal deformation member being configured to generate the second deformation amount by thermally deforming in the same environment as the superconducting coil.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A superconducting magnet device comprising a superconducting coil, an insulating load support, a vacuum vessel, and a thermal deformation cancellation mechanism, at least the superconducting coil being housed in the vacuum vessel in a state in which the superconducting coil is supported by the insulating load support, wherein the insulating load support is configured to support the superconducting coil via the thermal deformation cancellation mechanism, the thermal deformation cancellation mechanism being configured to generate a second deformation amount in a direction in which a first deformation amount applied from the superconducting coil to the insulating load support is canceled out due to thermal deformation occurring in the superconducting coil when the inside of the vacuum vessel is cooled to an extremely low temperature, and the thermal deformation cancellation mechanism includes a thermal deformation member that includes at least a material having a second coefficient of thermal expansion determined based on a first coefficient of thermal expansion of a material forming the superconducting coil, and the thermal deformation member being configured to generate the second deformation amount by thermally deforming in the same environment as the superconducting coil.

2. The superconducting magnet device according to claim 1, wherein the first coefficient of thermal expansion and the second coefficient of thermal expansion are different coefficients of thermal expansion.

3. The superconducting magnet device according to claim 2, wherein the thermal deformation member is a plate in a curved shape having a curved portion with a concave central portion, opposing ends of the thermal deformation member are connected to the superconducting coil such that the curved portion is concave toward the superconducting coil, the center of the curved portion is connected to the insulating load support, the second coefficient of thermal expansion is greater than the first coefficient of thermal expansion, and the curved portion thermally deforms at the second coefficient of thermal expansion in the same environment as the superconducting coil to generate the second deformation amount.

4. The superconducting magnet device according to claim 2, wherein the thermal deformation member is a plate in a curved shape having a curved portion with a convex central portion, opposing ends of the thermal deformation member are connected to the superconducting coil such that the curved portion is convex toward a side opposite the superconducting coil, the center of the curved portion is connected to the insulating load support, the second coefficient of thermal expansion is less than the first coefficient of thermal expansion, and the curved portion thermally deforms at the second coefficient of thermal expansion in the same environment as the superconducting coil to generate the second deformation amount.

5. The superconducting magnet device according to claim 2, wherein the thermal deformation member includes a pair of plates obtained by dividing a plate in a curved shape having a curved portion with a convex central portion into two at a dividing point at the center of the curved portion, ends of the divided plates opposite the dividing point are connected to the superconducting coil such that the curved portion is convex on a side opposite the superconducting coil, the ends of the divided plates on the side of the dividing point are connected to the insulating load support, the second coefficient of thermal expansion is less than the first coefficient of thermal expansion, and the ends on the side of the dividing point thermally deform at the second coefficient of thermal expansion in the same environment as the superconducting coil to generate the second deformation amount.

6. The superconducting magnet device according to claim 2, wherein the superconducting coil is housed in a radiation shield, the insulating load support supports the superconducting coil along with the radiation shield via the thermal deformation cancellation mechanism, the thermal deformation cancellation mechanism comprises a first thermal deformation member that is the thermal deformation member connecting at least the superconducting coil and the insulating load support, and a second thermal deformation member that is the thermal deformation member connecting at least the radiation shield and the insulating load support, the first thermal deformation member is a first plate having a first curved shape with a first curved portion having a concave central portion, opposing ends of the first plate are connected to the superconducting coil such that the first curved portion is concave toward the superconducting coil, the center of the first curved portion is connected to the insulating load support, a (2-1)-th coefficient of thermal expansion that is the second coefficient of thermal expansion of the first thermal deformation member is greater than a (1-1)-th coefficient of thermal expansion that is the first coefficient of thermal expansion of the superconducting coil, the first curved portion thermally deforms at the (2-1)-th coefficient of thermal expansion in the same environment as the superconducting coil to generate the second deformation amount, the second thermal deformation member is composed of a pair of second plates obtained by dividing a plate having a second curved shape having a second curved portion with a convex central portion into two at a dividing point at the center of the second curved portion, ends of the divided second plates opposite the dividing point are connected to the radiation shield such that the second curved portion is convex on a side opposite the radiation shield, ends of the divided second plates on the side of the dividing point are connected to the insulating load support, a (2-2)-th coefficient of thermal expansion that is the second coefficient of thermal expansion of the second thermal deformation member is less than a (1-2)-th coefficient of thermal expansion that is the first coefficient of thermal expansion of the radiation shield, and the ends on the side of the dividing point thermally deform at the (2-2)-th coefficient of thermal expansion in the same environment as the superconducting coil to generate the second deformation amount.

7. The superconducting magnet device according to claim 1, comprising a plurality of insulating load supports, wherein the insulating load supports are disposed to surround the superconducting coil in a plurality of directions within the vacuum vessel, and support the superconducting coil via the thermal deformation cancellation mechanism at positions where the insulating load supports are disposed.

8. A magnetic resonance imaging apparatus comprising:

a superconducting magnet device that includes a superconducting coil, an insulating load support, a vacuum vessel, and a thermal deformation cancellation mechanism, at least the superconducting coil being housed in the vacuum vessel in a state in which the superconducting coil is supported by the insulating load support, wherein the insulating load support is configured to support the superconducting coil via the thermal deformation cancellation mechanism, the thermal deformation cancellation mechanism being configured to generate a second deformation amount in a direction in which a first deformation amount applied from the superconducting coil to the insulating load support is canceled out due to thermal deformation occurring in the superconducting coil when the inside of the vacuum vessel is cooled to an extremely low temperature, and the thermal deformation cancellation mechanism includes a thermal deformation member that includes at least a material having a second coefficient of thermal expansion determined based on a first coefficient of thermal expansion of a material forming the superconducting coil, and the thermal deformation member being configured to generate the second deformation amount by thermally deforming in the same environment as the superconducting coil;

a static magnetic field power supply configured to supply power to the superconducting magnet device; and control circuitry configured to control supply of the power by at least the static magnetic field power supply at the time of generating a magnetic resonance image of a subject imaged in a space of a static magnetic field generated by the superconducting magnet device.

* * * * *